(12) United States Patent
Chi

(10) Patent No.: US 6,255,713 B1
(45) Date of Patent: Jul. 3, 2001

(54) CURRENT SOURCE USING MERGED VERTICAL BIPOLAR TRANSISTOR BASED ON GATE INDUCED GATE LEAKAGE CURRENT

(75) Inventor: Min-hwa Chi, Hsinchu (TW)

(73) Assignee: Taiwan Semiconductor Manufacturing Corporation, Hsinchu (TW)

( * ) Notice: Subject to any disclaimer, the term of this patent is extended or adjusted under 35 U.S.C. 154(b) by 0 days.

(21) Appl. No.: 09/362,916

(22) Filed: Jul. 27, 1999

(51) Int. Cl.[7] .................................................. H01L 29/00
(52) U.S. Cl. ........................ 257/526; 257/548; 257/549; 257/552
(58) Field of Search ..................................... 257/368, 370, 257/378, 526, 548, 549, 552; 438/202, 205, 234, 309

(56) References Cited

U.S. PATENT DOCUMENTS 5,495,124 * 2/1996 Terashima ............................ 257/550

FOREIGN PATENT DOCUMENTS 4-222117 * 8/1992 (JP).

* cited by examiner

*Primary Examiner*—Steven Loke
*Assistant Examiner*—Hung Kim Vu
(74) *Attorney, Agent, or Firm*—Blakely Sokoloff Taylor & Zafman, LLP (57) ABSTRACT

A current source formed in a p-type substrate is disclose. First, a deep n-well is formed within the p-type substrate and a buried n+ layer is formed within the deep n-well. Next, a p-well is formed within the deep n-well and atop the buried n+ layer. The p-well and deep n-well are then surrounded by an isolation structure that extends from the surface of the substrate to below the level of the p-well. A n+ reference structure is formed within the p-well and a gate is formed above the p-well, the gate separated from the substrate by a thin oxide layer, the gate extending over at least a portion of the n+ reference structure. Finally, a n+ output structure is formed within the p-well. An input reference current is provided to the n+ reference structure and an output current is provided by the n+ output structure.

14 Claims, 7 Drawing Sheets

CURRENT SOURCE USING MERGED VERTICAL BIPOLAR TRANSISTOR BASED ON GATE INDUCED GATE LEAKAGE CURRENT

TECHNICAL FIELD OF THE INVENTION

The present invention relates to an integrated circuit current source, and more particularly, to a current source using a merged vertical bipolar transistor that is based on gate induced drain leakage (GIDL) current.

BACKGROUND OF THE INVENTION

Figure 1:
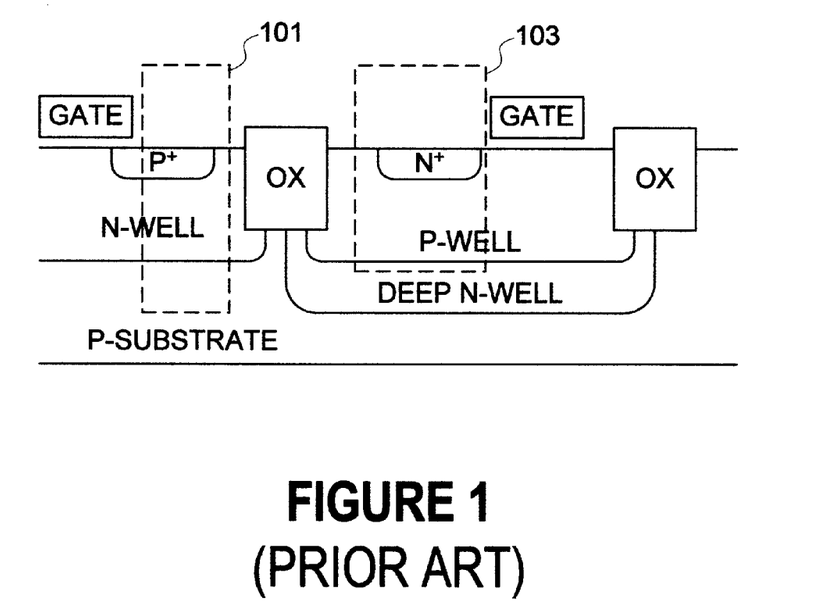
FIG. 1 is a cross-section of a semiconductor substrate showing parasitic bipolar transistors in a prior art twin-well and triple-well structure.

Conventional CMOS semiconductor devices, such as the n-channel ETOX cell, are often fabricated by a twin-well process or a triple-well process. As seen in FIG. 1, the triple-well process can provide a parasitic vertical pnp 101 bipolar transistor as well as a parasitic vertical npn 103 bipolar transistor. These transistors are typically used for crucial circuit applications (e.g. voltage reference) in CMOS VLSI. The n+ and p+ source and drain structures can serve as the n+ and p+ emitters. The p-well and n-well can act as the bases and the deep n-well and p+ substrate as collectors. These bipolar transistors are in "common collector" or "emitter-up" configuration.

These vertical bipolar transistors of the prior art have several limitations.

First, they share the same p-substrate or deep n-well as their collectors and therefore can only be configured in "common collector" mode. Second, the bipolar amplification of the pnp 101 and npn 103 are typically less than three in modern CMOS technology (i.e. 0.35 µm and below) due to the limitation of the well depth (as base width) and a retrograded well doping profile (desirable in advanced CMOS process for suppressing latch-up).

Figure 3:
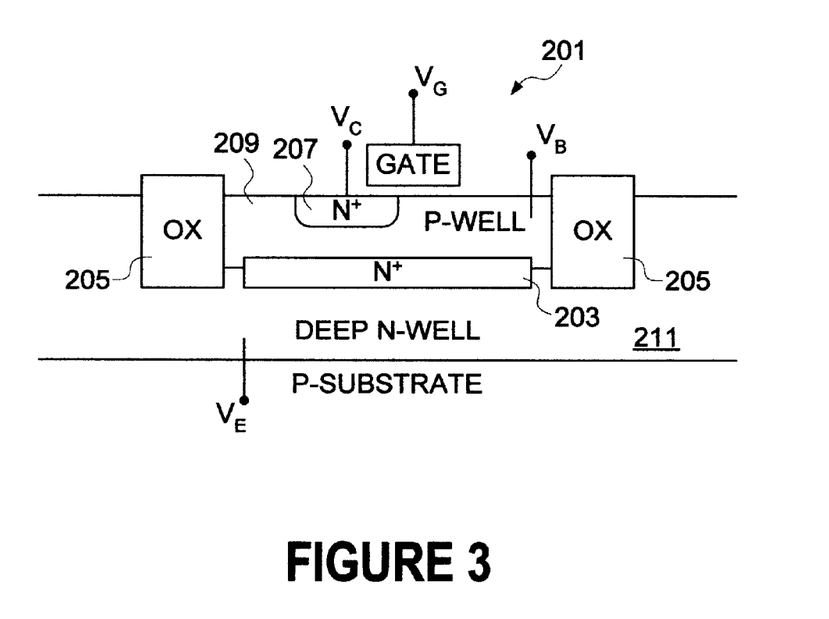
FIGS. 3A and 3B are schematic diagrams of prior art current sources using vertical bipolar transistors.

The vertical bipolar transistors 101 and 103 are often used to form current sources. FIGS. 3A and 3B show prior art current sources, with FIG. 2A showing a current source 301 using two npn transistors 303$a$ and 303$b$ and FIG. 3B showing a current source 351 using two pnp transistors 353$a$ and 353$b$. The output current $I_o$ can be designed to be proportional to the reference current $I_{ref}$ by adjusting the ratio of the emitter areas of the transistors. For example, in FIG. 3A, the following relationship can be stated:

$$I_o \approx I_{ref}[A_{e2}/A_{e1}]$$

where $A_{e2}$ is the area of the emitter of transistor 303$b$ and $A_{e1}$ is the area of the emitter of transistor 303$a$.

Similarly, in FIG. 3B, the following relationship can be stated:

$$I_o \approx I_{ref}[A_{e2}/A_{e1}]$$

where $A_{e2}$ is the area of the emitter of transistor 353$b$ and $A_{e1}$ is the area of the emitter of transistor 353$a$.

The conventional designs of FIG. 3A and 3B are relatively large because of the interconnections required. Thus, what is needed is a new design for a current source that overcomes the disadvantages of the prior art and provides other advantages.

SUMMARY OF THE INVENTION

A current source formed in a p-type substrate is disclosed. The current source comprises: a deep n-well formed within said p-type substrate; a buried n+ layer formed within said deep n-well; a p-well formed within said deep n-well and atop said buried n+ layer; an isolation structure surrounding said p-well and extending from the surface of said substrate to below the level of said p-well; a n+ reference structure formed within said p-well; a gate formed above said p-well, said gate separated from said substrate by a thin oxide layer, said gate extending over at least a portion of said n+ reference structure; and a n+ output structure formed within said p-well; wherein an input reference current is provided to said n+ reference structure and an output current is provided by said n+ output structure.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 2A:
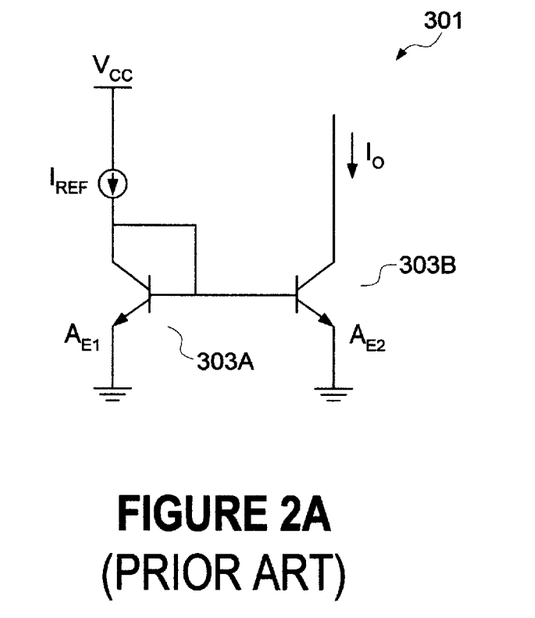
FIG. 2 is a cross-section of a semiconductor substrate showing an npn vertical bipolar transistor formed in accordance with the present invention.
Figure 2B:
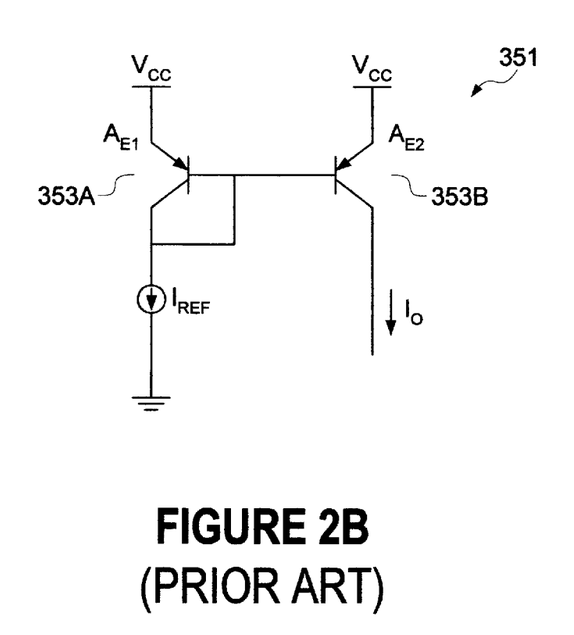

Turning to FIG. 2, a vertical gated npn bipolar transistor 201 formed in accordance with the present invention has three additional features compared to the conventional parasitic npn bipolar transistor 103 cell shown in FIG. 1. First, a buried n+ layer 203 is formed underneath the p-well 209 and above the deep n-well 211. Second, oxide trench isolations 205 are formed for isolating the p-well 209. Third, the gate is formed to overlay both the n+ region 207 (the collector) and the p-well 209 (the base). Note also that there is no need for a base contact for the turn-on operation described below. In addition, there is also no need for a lightly doped drain (LDD) implant and spacer in the gated base-collector structure, which will be used for GIDL generation for the turn-on operation. The lightly doped drain structure would only suppress the GIDL generation.

The buried n+ layer 203 can be easily formed by using an additional masking step (opening the cell area after the deep n-well is defined) and high energy ion implant of an n-type dopant (e.g. $p^{31}$ or As). As will be seen with greater detail below, the implant process must be carefully designed to achieve three goals: (1) small base width (for larger gain), (2) higher emitter doping than the p-well doping (for high injection efficiency), and less total $p^{31}$ dose (for less damage by the high energy implant). The buried n+ layer 203 is preferably implemented by $p^{31}$ with multiple energies (500 Kev and 750 Kev) with doses of about 1E15 each on current triple-well 0.35 micron CMOS technology. The buried n+ layer 203 together with the deep n-well will serve as the emitter for the bipolar transistor 201. The p-well 209 serves as the base and the n+ region 207 as the collector. Thus, the npn bipolar transistor 201 will be used in "common emitter" configuration and turned-on by GIDL current from the gated base-collector (p-well and n+) structure.

The trench isolations 205 preferably extend deeper than the p-well depth (approx. 1 micron). The trench isolations 205 can be formed by a masking step for a trench etch at the front end of the fabrication process. In comparison, typical shallow trench isolation structures for 0.35 micron CMOS transistors extend only about 0.3–0.5 microns deep. Thus, trench isolations 205 for isolating p-wells can also be used as shallow trench isolation structures for CMOS transistors. The trench isolation technique will result in smaller spacing and is therefore preferred. In any case, the trench isolations 205 must be at least slightly deeper than the p-well depth.

The dose and energy of the buried n+ layer 203 will determine the position of the emitter junction and the bipolar amplification gain (β) of the bipolar action. The bipolar action can be maximized by higher electron injection efficiency (from the buried n+ layer to the p-well) with a smaller base (p-well) width (in the vertical dimension).

Figure 4:
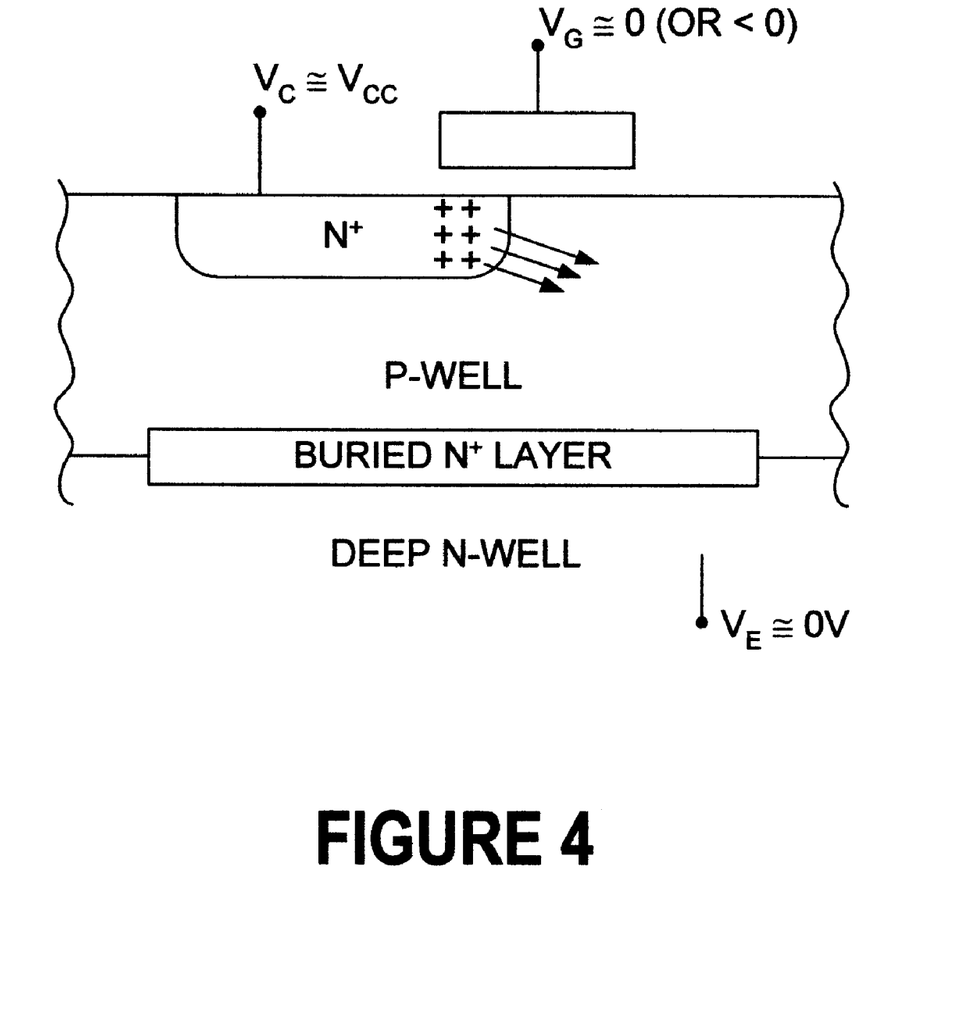
FIG. 4 is a detail of the bipolar transistor of FIG. 2 during the turn-on operation.

The npn transistor 201 can be turned on by GIDL current, as seen in more detail in FIG. 4. Initially, when the transistor 201 is off, the collector is biased at a higher potential than the emitter: $V_E=0$ volts and $V_C=V_{cc}$, where $V_{cc}$ is the external power supply, typically 3.3 volts for 0.35 CMOS technology. The gate potential $V_G$ is biased to the highest potential $+V_{cc}$. Note that the base (p-well) is left floating and its potential is clamped to that of the n+ buried layer.

When the transistor 201 is to be turned on, $V_G$ is pulsed down to the lowest potential, e.g. 0 volts or lower. This causes the surface of the n+ collector to generate holes by the band-to-band tunneling mechanism. See H. Wann, P. Ko, and C. Hu, "*Gate Induced Band-to-Band Tunneling Leakage Current in LDD MOSFETs*", Technical Digest of Int'l Electron Device Meetings, Paper No. 6.5, pages 147–150, 1992. The holes will flow into the base (the p-well) as base current by the field in the depletion region at the n+ collector to p-well junction. The base-to-emitter junction (i.e. p-well to n+ buried layer) is thus forward biased and the bipolar action is triggered.

The transistor 201 can be turned off by pulsing the gate to high ($+V_{cc}$) so that there is no GIDL current flowing into the base (i.e. base current terminated). The gated vertical bipolar transistor is therefore turned off by an "open base" turn-off mechanism.

The speed of the bipolar transistor turn-on is based on the magnitude of the GIDL current. In order to maximize the GIDL current at the gated n+/p-well base junction, the usual lightly doped drain implant and spacer are not needed, since they will only suppress the GIDL generation, and therefore slow down the turn-on operation.

The transistor 201 can also be used as a conventional bipolar transistor by adding a base contact and removing the gate overlap over the collector/base junction. Furthermore, the n+ region 207 and the n+ buried layer 203 can be interchangeably used as either the collector or the emitter; therefore, the transistor 201 can be used in both common emitter and common collector configuration based on the need of the circuit.

Figure 5:
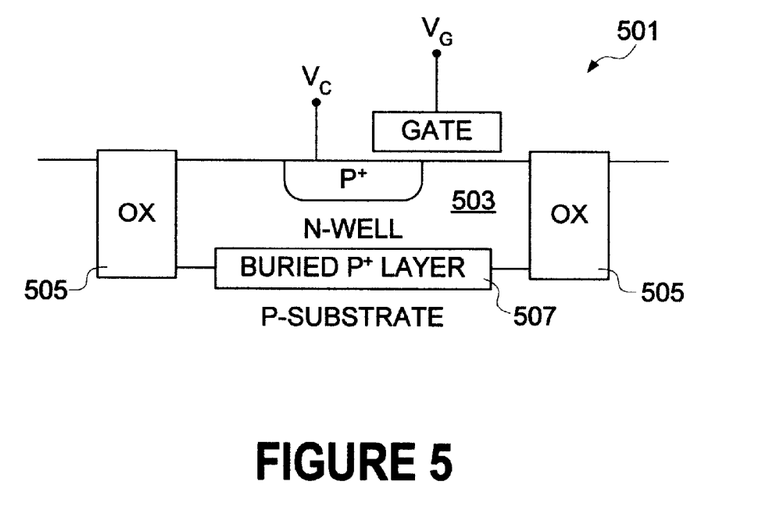
FIG. 5 is a cross-section of a semiconductor substrate showing a pnp vertical bipolar transistor formed in accordance with the present invention.

FIG. 5 shows the pnp version of a vertical gated pnp bipolar transistor 501. The transistor is formed by the p+ well/n-well/p-substrate. Notice that the depth of the n-well 503 is almost the same as that of the p-well, therefore, the trench isolation 505 can also be used for isolating the n-wells 503. The pnp gated bipolar transistor 501 exists in twin-well or triple-well process with the additional feature of the buried p+ layer 507.

Figure 6:
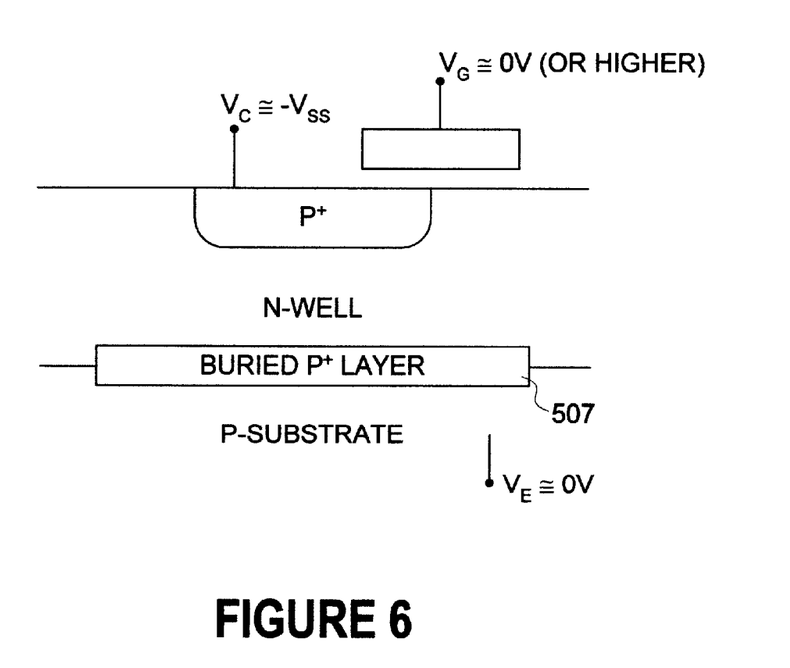
FIG. 6 is a detail of the bipolar transistor of FIG. 5 during the turn-on operation.

The pnp transistor 501 can be turned on by GIDL current, as seen in more detail in FIG. 6. Initially, when the transistor 501 is off, the collector is biased at a lower potential than the emitter: $V_E=0$ volts and $V_C=V_{cc}$, where $V_{cc}$ is the external power supply, typically 3.3 volts for 0.35 CMOS technology. The gate potential $V_G$ is biased to the lowest potential $-V_{cc}$. Note that the base (n-well) is left floating and its potential is clamped to that of the p+ buried layer 507.

When the transistor 501 is to be turned on, $V_G$ is pulsed up to 0 volts or higher. This causes the surface of the p+ collector to generate electrons by the band-to-band tunneling mechanism. The electrons will flow into the base (the n-well) as base current by the field in the depletion region at the p+ collector to n-well junction. The emitter-to-base junction (i.e. n-well to p+ buried layer) is thus forward biased and the bipolar action is triggered.

The transistor 501 can be turned off by pulsing the gate back to low ($-V_{cc}$) so that there is no GIDL current flowing into the base (i.e. base current terminated). The gated vertical bipolar transistor is therefore turned off by an "open base" turn-off mechanism.

Figure 7:
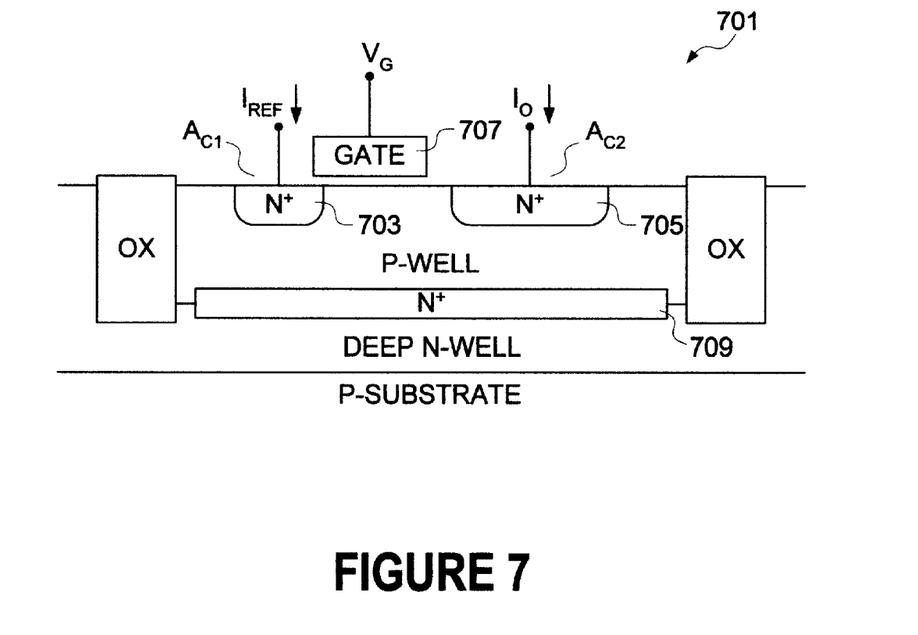
FIG. 7 is a cross-section of a semiconductor substrate showing a current source formed in accordance with the present invention.
Figure 8:
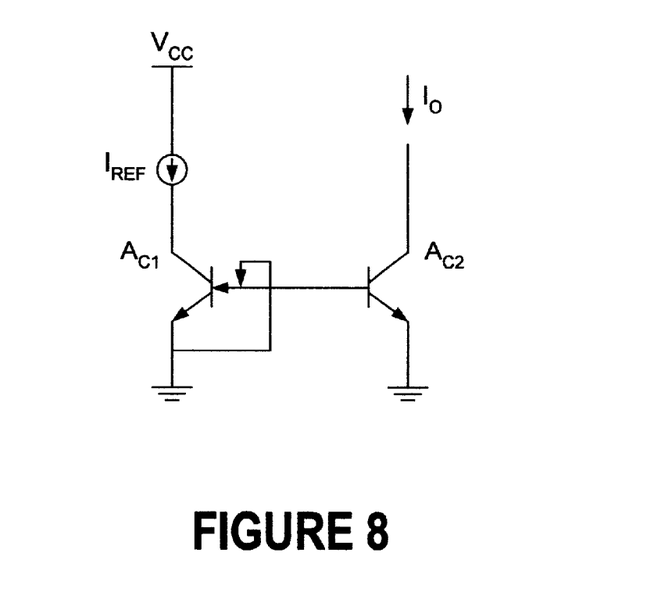
FIG. 8 is a schematic diagram of the current source of FIG. 7.

Turning to FIG. 7, a current source 701 based upon the above disclosed bipolar transistor is now described. Note that the current source 701 is simply the disclosed bipolar transistor of FIG. 2 with two collectors formed in the p-well. FIG. 8 shows the current source 701 in schematic form. A reference collector 703 is formed in the p-well and is connected to a reference current $I_{ref}$. An output collector 705 is also formed in the p-well and is connected to the current output $I_o$. A gate 707 is formed atop of the p-well and separated from the p-well from a gate oxide. The gate 707 overlaps the reference collector 703 and the p-well, but does not overlap the output collector 705. The gate is connected to ground (e.g. 0 volts) and the potential of the reference collector is high (i.e. $V_{cc}$) enough so that holes can be generated on the surface of the reference collector 703 and flow into the p-well as base current.

The forward biased base-to-emitter junction results in more electrons being injected from the buried n+ emitter 709 into the base, and in turn, the bipolar action directs electrons toward the collectors. The vertical bipolar npn transistor is turned on enough until Iref is flowing into the reference collector node. The $I_o$ at the output collector 705 is designed to be proportional to $I_{ref}$ by the ratio of the collector areas. In other words, the current source has a current output defined as:

$$I_o \approx I_{ref}[A_{c2}/A_{c1}]$$

where $A_{c2}$ is the area of the output collector 705 and $A_{c1}$ is the area of the reference collector 703.

Figure 9:
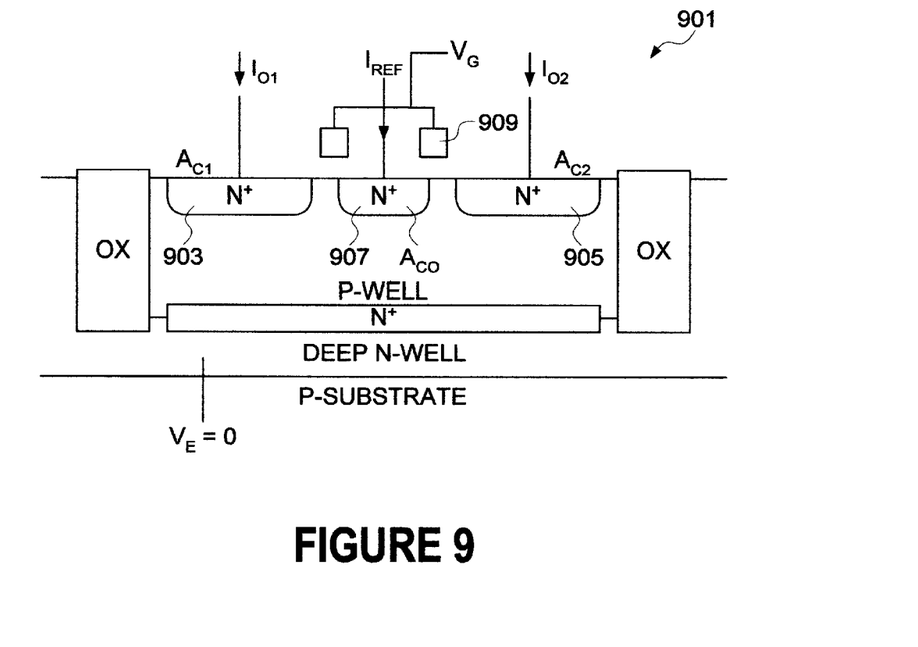
FIG. 9 is a cross-section of a semiconductor substrate showing a multi-output current source formed in accordance with the present invention.
Figure 10:
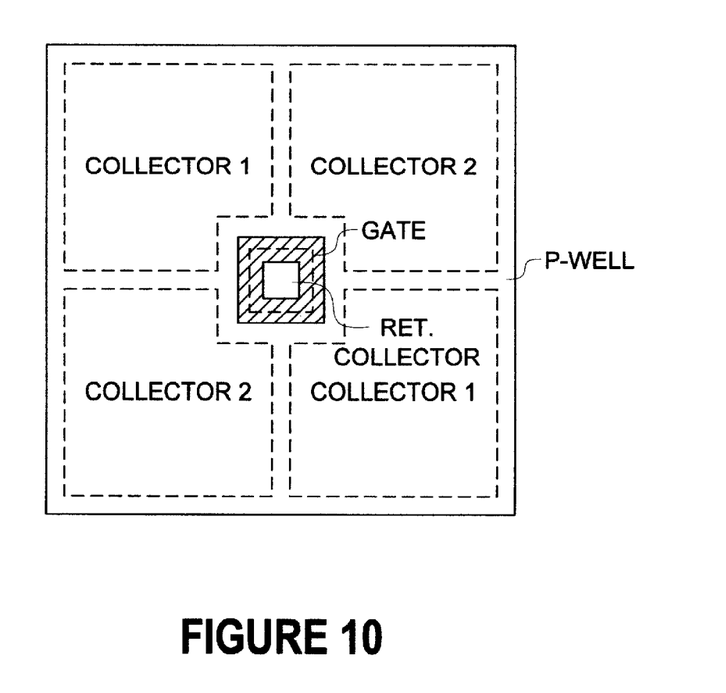
FIG. 10 is a top view of the multi-output current source of FIG. 9.

It is a simple extension to provide a current source with multiple outputs. Turning to FIG. 9, a current source 901 has multiple outputs formed by multiple output collectors formed within the p-well. The magnitude of an output current can be easily manipulated and controlled by adjusting the area of the collector areas. As seen in FIG. 9, a first output collector 903 and a second output collector 905 are formed in the p-well. A reference collector 907 is also formed in the p-well. A gate 909 is formed to overlap both the reference collector 907 and the p-well. The layout of the output collectors 903 and 905 can be designed in a symmetrical manner, so that the output currents can be matched with precision. One example of a suitable layout design is shown in FIG. 10, where $I_{o1}$ and $I_{o2}$ are designed to be identical in a very precise manner, e.g., insensitive to misalignment in both x and y directions of poly-to-collector and collector-to-active area. The center reference collector is connected to the reference current. The poly-gate is on top of the center reference collector edge (but not any other collector) so that GIDL current is only included in $I_{ref}$. In this way, the matching of $I_o$ can be more precise.

Figure 11:
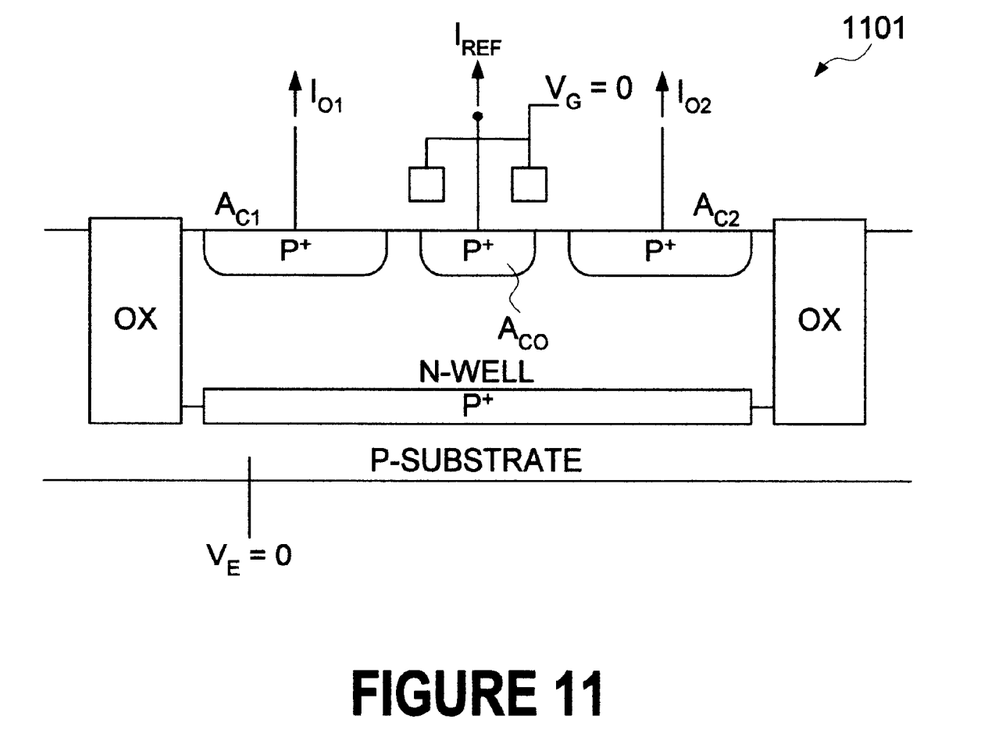
FIG. 11 is a cross-section of a semiconductor substrate showing a multi-output current source using pnp bipolar transistors formed in accordance with the present invention.

Turning to FIG. 11, the implementation of a current source 1101 using pnp bipolar transistors can be easily accomplished. Notice that the pnp version in FIG. 11 has reversed polarity voltage bias and silicon region as well as directions of current flow compared to the npn version. The pnp version of the current source is useful in mixed-signal circuits with on-chip negative bias. For common CMOS logic, where only $+V_{cc}$ is available, there is no need for the pnp version.

The current sources of the present invention provide several advantages over the prior art of FIGS. 3A and 3B. First, the merged bipolar transistors (with multiple collectors) require less interconnections, e.g. metal connection from base to collector, from the transistor to transistor, etc... As a result, the current source of the present invention can be made significantly smaller in size. Second, the output current matching can be very precise due to the ease of implementing a symmetrical collector layout. Third, the GIDL current is not temperature sensitive and as a result, the output current can be much less temperature sensitive.

Moreover, the current source of the present invention can easily be modified to be switched current sources by connecting the gates to a control signal line carrying a control signal instead of shorting to ground.

Note that if the gate is on the edge of both the reference collector and the output collector, the GIDL current generated on both the reference and output collectors will flow into the base together. Since the GIDL current is sensitive to voltage between the gate and output collector, the portion of GIDL base current generated from the output collector will fluctuate and reduces the output resistance of the current source. Therefore, it is more preferred to avoid GIDL current along the output collector. Thus, the gate should not overlap the output collector.

For further improving the output resistance of the current source, the "base width" modulation effect should be reduced. The base width decreases when the collector bias increases in magnitude. The output collector doping profile can be made more graded by additional implantation process, e.g. $p^{31}$ implant for the n+ collectors and $B^{11}$ for the p+ collectors. This collector implant can also reduce the base width and further increase the amplification factor of bipolar transistors.

While the preferred embodiment of the invention has been illustrated and described, it will be appreciated that various changes can be made therein without departing from the spirit and scope of the invention.

What is claimed is:

1. A current source formed in a p-type substrate comprising:
   a deep n-well formed within said p-type substrate;
   a buried n+ layer formed within said deep n-well;
   a p-well formed within said deep n-well and atop said buried n+ layer;
   an oxide isolation structure surrounding said p-well and extending from the surface of said deep n-well to below the level of said p-well;
   a n+ reference structure formed within said p-well;
   a gate formed above said p-well, said gate separated from said substrate by a thin oxide layer, said gate extending over at least a portion of said n+ reference structure; and
   a n+ output structure formed within said p-well, said n+ output structure not extending to said gate;
   wherein an input reference current is provided to said n+ reference structure and an output current is provided by said n+ output structure.

2. The current source of claim 1 wherein said buried n+ layer is formed using a high energy implanter so that the buried n+ layer has a higher dopant concentration than said p-well.

3. The transistor of claim 1 wherein the current source is turned on by:
   biasing said deep n-well to 0 volts;
   biasing said gate to no more than 0 volts; and
   leaving said p-well floating.

4. The current source of claim 1 further including a control signal line connected to said gate, said control signal line carrying a control signal that can turn on or turn off said current source, said control signal being a voltage of 0 volts to turn on said current source and a voltage of $+V_{cc}$ to turn off said current source.

5. The current source claim 1 wherein said isolation structure is a trench isolation.

6. The current source of claim 1 further including a second n+ output structure formed in said p-well that provides a second output current.

7. The current source of claim 1 wherein the output current ($I_o$) is related to the input reference current ($I_{ref}$) by:

$$I_o \approx I_{ref}[A_{c2}/A_{c1}]$$

where $A_{c2}$ is the area of the n+ output structure and $A_{c1}$ is the area of the n+ reference structure.

8. A current source formed in a p-type semiconductor substrate comprising:
   a buried p+ layer formed within said substrate;
   a n-well formed within said p-type substrate and atop said buried p+ layer;
   an oxide isolation structure surrounding said n-well and extending from the surface of said n-well to below the level of said n-well;
   a p+ reference structure formed within said n-well;
   a gate formed above said n-well, said gate separated from said substrate by a thin oxide layer, said gate extending over at least a portion of said p+ reference structure; and
   a p+ output structure formed within said n-well, said p+ output structure not extending to said gate;
   wherein an input reference current is provided to said p+ reference structure and an output current is provided by said p+ output structure.

9. The current source of claim 8 wherein said buried p+ layer is formed using a high energy implanter so that the buried p+ layer has a higher dopant concentration than said deep n-well.

10. The current source of claim 8 wherein the current source is turned on by:
   biasing said p-type substrate to 0 volts;
   biasing said gate to greater than or equal to 0 volts; and
   leaving said n-well floating.

11. The current source of claim 8 further including a control signal line connected to said gate, said control signal line carrying a control signal that can turn on or turn off said current source, said control signal being a voltage of 0 volts to turn on said current source and a voltage of $-V_{cc}$ to turn off said current source.

12. The current source claim 8 wherein said isolation structure is a trench isolation.

13. The current source of claim 8 further including a second p+ output structure formed in said n-well that provides a second output current.

14. The current source of claim 8 wherein the output current ($I_o$) is related to the input reference current ($I_{ref}$) by:

$$I_o \approx I_{ref}[A_{c2}/A_{c1}]$$

where $A_{c2}$ is the area of the p+ output structure and $A_{c1}$ is the area of the p+ reference structure.

* * * * *